(12) United States Patent
Uemura

(10) Patent No.: US 11,749,324 B2
(45) Date of Patent: *Sep. 5, 2023

(54) VARIABLE CLOCK DIVIDER

(71) Applicant: MICRON TECHNOLOGY, INC., Boise, ID (US)

(72) Inventor: Yutaka Uemura, Hachioji (JP)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/935,016

(22) Filed: Sep. 23, 2022

(65) Prior Publication Data

US 2023/0014446 A1    Jan. 19, 2023

Related U.S. Application Data

(63) Continuation of application No. 17/020,508, filed on Sep. 14, 2020, now Pat. No. 11,456,024.

(51) Int. Cl.
  *G11C 7/22*     (2006.01)
  *G11C 7/10*     (2006.01)
  *H03K 23/52*    (2006.01)
  *G11C 29/10*    (2006.01)
  *H03K 23/00*    (2006.01)

(52) U.S. Cl.
  CPC .............. *G11C 7/222* (2013.01); *G11C 7/106* (2013.01); *G11C 7/1036* (2013.01); *G11C 7/1045* (2013.01); *G11C 7/1087* (2013.01); *G11C 29/10* (2013.01); *H03K 23/002* (2013.01); *H03K 23/52* (2013.01)

(58) Field of Classification Search
  CPC ....... G11C 7/222; G11C 7/1045; G11C 7/106; G11C 7/1087; G11C 9/10; H03K 23/002; H03K 23/52

See application file for complete search history.

(56) References Cited

U.S. PATENT DOCUMENTS 6,111,807 A * 8/2000 Ooishi .................. G11C 7/22
                                                    365/230.03
6,279,090 B1   8/2001 Manning
            (Continued)

FOREIGN PATENT DOCUMENTS

KR     100635500 B1   10/2006
WO     2022055881      3/2022

OTHER PUBLICATIONS

ISR/WO dated Dec. 30, 2021 for PCT Appl. No. PCT/US2021/049283.

*Primary Examiner* — Tuan T Nguyen
(74) *Attorney, Agent, or Firm* — Dorsey & Whitney LLP

(57) ABSTRACT

Disclosed herein is an apparatus that includes a first group including a plurality of first latch circuits coupled in series and a second group including a plurality of second latch circuits coupled in series. Each of the first latch circuits performs a latch operation in synchronization with a rise trigger signal. Each of the second latch circuits performs a latch operation in synchronization with a fall trigger signal. The rise and fall trigger signals are alternately activated every even clock cycles or every odd clock cycles. In response to a division ratio, first one or more of the first and second latch circuits are bypassed and second one or more of the first and second latch circuits are cyclically coupled.

20 Claims, 10 Drawing Sheets

(56) References Cited

U.S. PATENT DOCUMENTS

| | | | |
|---|---|---|---|
| 2003/0031082 A1* | 2/2003 | Sawada | G11C 7/1066 |
| | | | 365/233.1 |
| 2014/0254287 A1 | 9/2014 | Lee | |
| 2017/0133065 A1* | 5/2017 | Hwang | G11C 7/10 |
| 2019/0221245 A1 | 7/2019 | Arai et al. | |
| 2019/0333553 A1* | 10/2019 | Choi | G11C 7/1051 |
| 2020/0153435 A1* | 5/2020 | Hong | H03K 17/693 |
| 2020/0285269 A1* | 9/2020 | Choi | G11C 19/28 |
| 2021/0209022 A1 | 7/2021 | Song | |
| 2022/0084569 A1 | 3/2022 | Uemura | |

\* cited by examiner

VARIABLE CLOCK DIVIDER

CROSS REFERENCE TO RELAYED APPLICATION(S)

This application is a continuation of U.S. patent application Ser. No. 17/020,508 filed Sep. 14, 2020. The aforementioned application is incorporated herein by reference, in its entirety, for any purpose.

BACKGROUND

Some semiconductor devices include a clock divider circuit that generates an output clock signal having a lower frequency than that of an input clock signal by dividing the input clock signal. It is sometimes desired that the clock divider circuit maintains the duty ratio of the output clock signal at 50% even when the division number is an odd number.

DETAILED DESCRIPTION

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structural, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 1:
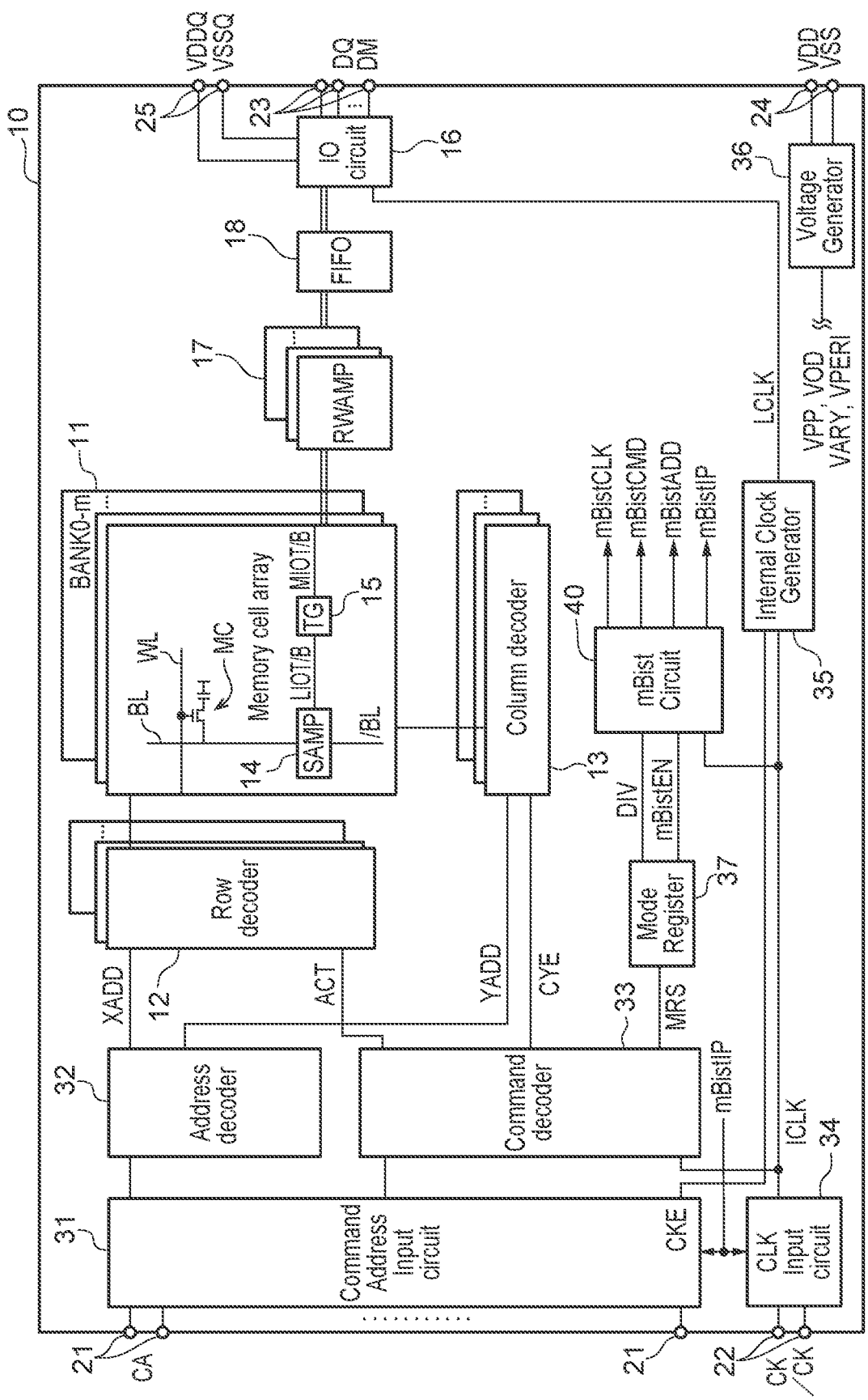
FIG. 1 is a block diagram of a semiconductor device according to one embodiment of the present disclosure.

FIG. 1 is a block diagram of a semiconductor device 10 according to one embodiment of the present disclosure. The semiconductor device 10 can be, for example, a DDR4 SDRAM (Double-Data-Rate 4 Synchronous Dynamic Random-Access Memory) incorporated into a single semiconductor chip. The semiconductor device 10 may be mounted on an external substrate such as a memory module substrate or a motherboard. As shown in FIG. 1, the semiconductor device 10 includes a memory cell array 11. The memory cell array 11 includes a plurality of word lines WL, a plurality of bit lines BL, and a plurality of memory cells MC respectively provided at intersections between the word lines WL and the bit lines BL. Selection of the word lines WL is performed by a row decoder 12 and selection of the bit lines BL is performed by a column decoder 13. A sense amplifier 14 is coupled to a corresponding one of the bit lines BL and a local I/O line pair LIOT/B. The local I/O line pair LIOT/B is coupled to a main I/O line pair MIOT/B via a transfer gate 15 that functions as a switch. The memory cell array 11 is divided into m+1 memory banks including memory banks BANK0 to BANKm.

A plurality of external terminals included in the semiconductor device 10 include a command address terminal 21, a clock terminal 22, a data terminal 23, and power terminals 24 and 25. The data terminal 23 is coupled to an I/O circuit 16.

A command address signal CA is supplied to the command address terminal 21. A signal related to an address in the command address signal CA supplied to the command address terminal 21 is transferred to an address decoder 32 via a command address input circuit 31, and a signal related to a command is transferred to a command decoder 33 via the command address input circuit 31. The address decoder 32 decodes the address signal to generate a row address XADD and a column address YADD. The row address XADD is supplied to the row decoder 12 and the column address YADD is supplied to the column decoder 13. An access control circuit may include circuits used to access the memory cell array 11, for example, the address decoder 32, command decoder 33, row decoder 12, and/or column decoder 13, by using an internal address signal and internal commands A clock enable signal CKE in the command address signal CA is supplied to an internal clock generator 35.

Complementary external clock signals CK and/CK are supplied to the clock terminal 22. The complementary external clock signals CK and/CK are input to a clock input circuit 34. The clock input circuit 34 generates an internal clock signal ICLK based on the complementary external clock signals CK and/CK. The internal clock signal ICLK is supplied to at least the command decoder 33, the internal clock generator 35, and a test circuit (mBist circuit) 40. The internal clock generator 35 is activated, for example, by the clock enable signal CKE and generates an internal clock signal LCLK based on the internal clock signal ICLK. The internal clock signal LCLK is supplied to the I/O circuit 16. The internal clock signal LCKL is used as a timing signal that defines a timing when read data DQ is to be output from the data terminal 23 in a read operation. In a write operation, write data is input from outside to the data terminal 23. A data mask signal DM may be input from outside to the data terminal 23 in the write operation.

Power potentials VDD and VSS are supplied to the power terminal 24. These power potentials VDD and VSS are supplied to a voltage generator 36. The voltage generator 36 generates various internal potentials VPP, VOD, VARY, VPERI, and the like based on the power potential VDD and VSS. The internal potential VPP is mainly used in the row decoder 12, the internal potentials VOD and VARY are mainly used in the sense amplifiers 14 included in the memory cell array 11, and the internal potential VPERI is used in other many circuit blocks.

Power potentials VDDQ and VSSQ are supplied from the power terminal 25 to the I/O circuit 16. Although the power potentials VDDQ and VSSQ can be same as the power potentials VDD and VSS supplied to the power terminal 24, respectively, dedicated power potentials VDDQ and VSSQ are allocated to the I/O circuit 16 to prevent power-supply noise that occurs in the I/O circuit 16 from propagating to other circuit blocks.

The command decoder 33 activates an active signal ACT when an active command is issued. The active signal ACT is supplied to the row decoder 12. When a read command or a write command is issued from outside following the active command, the command decoder 33 activates a column selection signal CYE. The column selection signal CYE is supplied to the column decoder 13 and a corresponding one of the sense amplifiers 14 is activated in response thereto. Accordingly, read data is read from the memory cell array 11 in the read operation. The read data having been read from the memory cell array 11 is transferred to the I/O circuit 16 via a read/write amplifier 17 and a FIFO (First-In First-Out) circuit 18 and is output from the data terminal 23 to outside. In the write operation, write data having been input from outside via the data terminal 23 is written into the memory cell array 11 via the I/O circuit 16, the FIFO circuit 18, and the read/write amplifier 17.

The command decoder 33 activates a mode register set signal MRS when a mode register set command is issued. The mode register set signal MRS is supplied to a mode register 37. When the mode register set signal MRS is activated, various control parameters stored in the mode register 37 are overwritten. The control parameters stored in the mode register 37 include a division signal DIV. When a test command is issued from outside, the mode register 37 outputs an enable signal mBistEN. The division signal DIV and the enable signal mBistEN are supplied to the test circuit 40.

Figure 2:
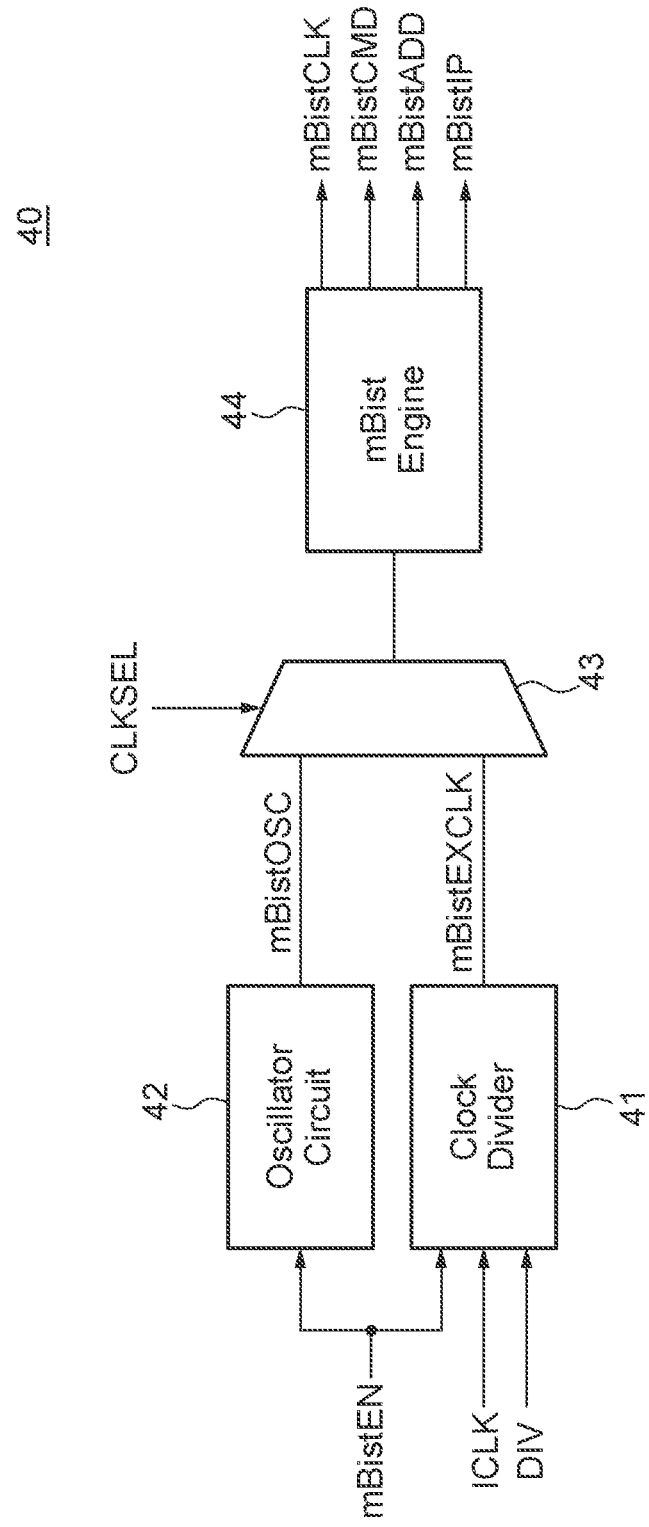
FIG. 2 is a block diagram of a test circuit according to one embodiment of the present disclosure.

FIG. 2 is a block diagram of a test circuit according to one embodiment of the present disclosure. As shown in FIG. 2, the test circuit 40 includes a clock divider circuit 41, an oscillator circuit 42, a multiplexer 43, and an mBist engine 44. The clock divider circuit 41 and the oscillator circuit 42 are activated by the enable signal mBistEN. The enable signal mBistEN is activated when a test operation using the test circuit 40 is to be performed. When the clock divider circuit 41 is activated, a divided clock signal mBistEXCLK is generated. The divided clock signal mBistEXCLK is a signal obtained by dividing the internal clock signal ICLK and the division ratio thereof is designated by the division signal DIV. The division signal DIV may be one of the control parameters set in the mode register 37. When the oscillator circuit 42 is activated, an oscillator signal mBistOSC having a predetermined frequency is generated. The divided clock signal mBistEXCLK and the oscillator signal mBistOSC are input to the multiplexer 43. The multiplexer 43 supplies either the divided clock signal mBistEXCLK or the oscillator signal mBistOSC to the mBist engine 44 on the basis of a clock selection signal CLKSEL. The mBist engine 44 automatically generates a clock signal mBistCLK for a test, an internal command mBistCMD for a test, and an internal address mBistADD for a test in synchronization with the divided clock signal mBistEXCLK or the oscillator signal mBistOSC. Accordingly, when the mBist engine 44 is activated, an automatic operation test for the memory cell array 11 is performed. During a period in which the operation test using the mBist engine 44 is performed, a state signal mBistIP is kept activated. The state signal mBistIP is supplied to the command address input circuit 31 and the clock input circuit 34 shown in FIG. 1. When the state signal mBistIP is activated, the command address input circuit 31 and the clock input circuit 34 are inactivated, whereby current consumption due to operations of the command address input circuit 31 and the clock input circuit 34 is reduced.

Figure 3A:
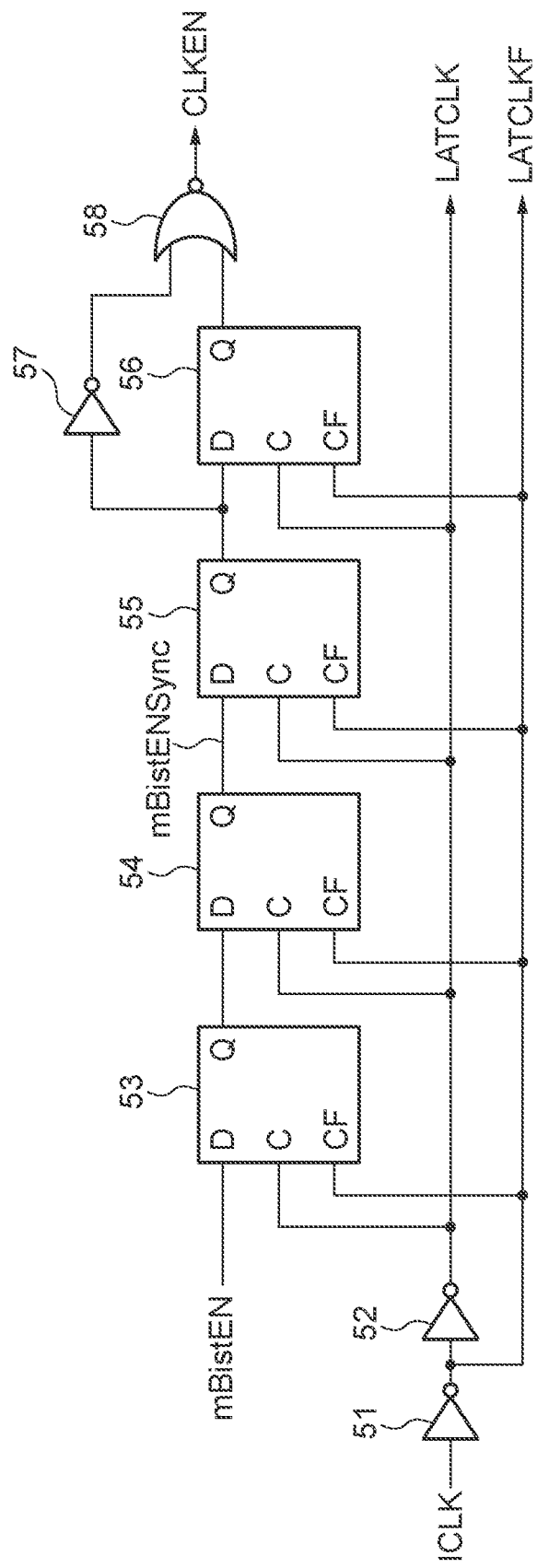
FIG. 3A and FIG. 3B are circuit diagrams of a clock divider circuit according to one embodiment of the present disclosure.
Figure 3B:
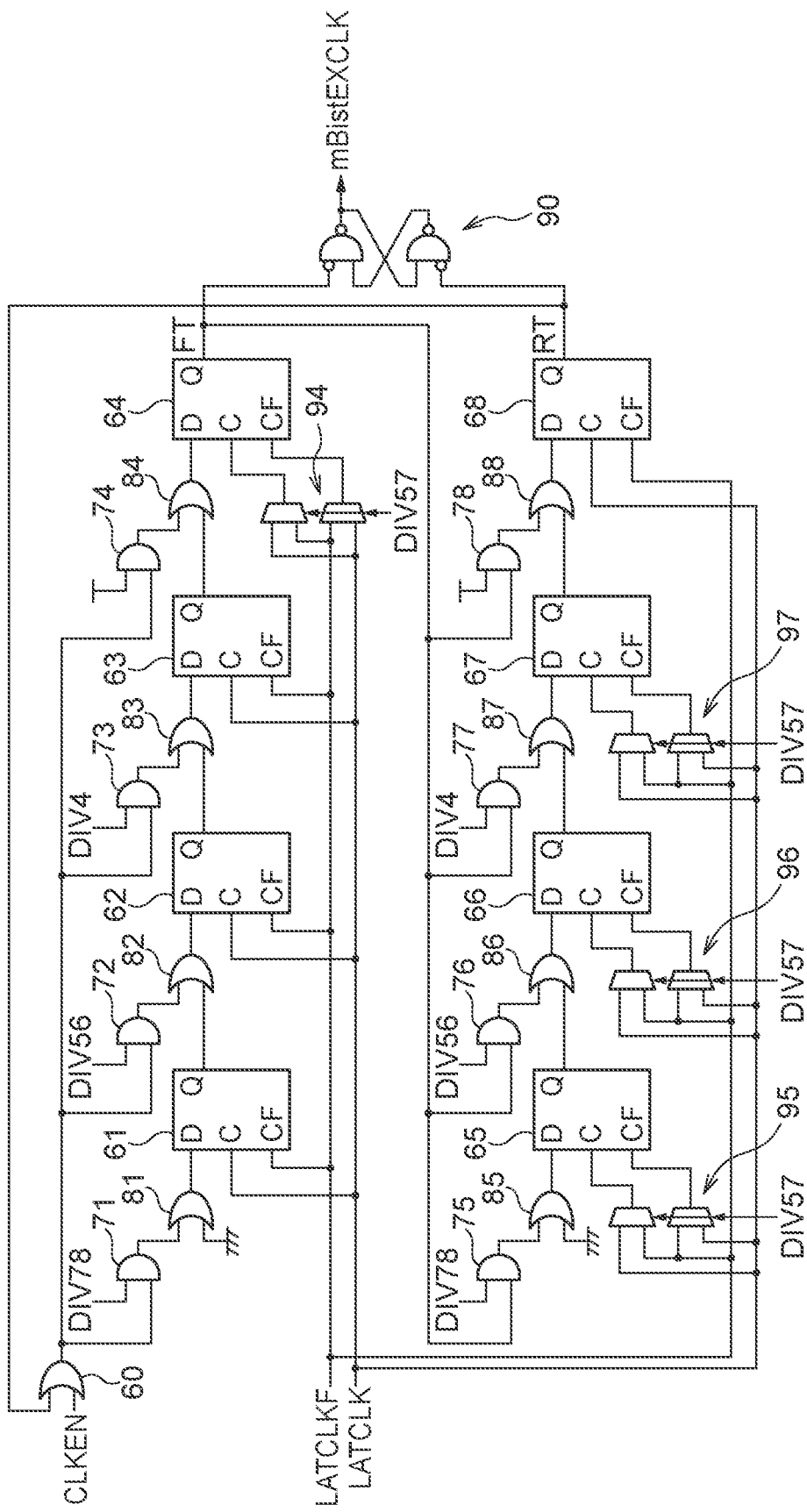

FIG. 3A and FIG. 3B are circuit diagrams of a clock divider circuit according to one embodiment of the present disclosure. As shown in FIG. 3A, the clock divider circuit 41 includes inverter circuits 51 and 52 through which the internal clock signal ICLK passes, whereby complementary latch clock signals LATCLK and LATCLKF are generated. The latch clock signal LATCLK is input to clock input nodes C of latch circuits 53 to 56 and the latch clock signal LATCLKF is input to inverted clock input nodes CF of the latch circuits 53 to 56. Each of the latch circuits 53 to 56 latches a signal supplied to a data input node D in synchronization with a rise edge of a signal input to the clock input node C and a fall edge of a signal input to the inverted clock input node CE The latched signal is output from each data output node Q. This operation is performed similarly in latch circuits 61 to 68 shown in FIG. 3B.

The enable signal mBistEN is supplied to the data input node D of the latch circuit 53. An output signal of the latch circuit 53 is supplied to the latch circuit 54 and accordingly an enable signal mBistENSync output from the latch circuit 54 is synchronized with the latch clock signals LATCLK and LATCLKF. The enable signal mBistENSync is supplied to the data input node D of the latch circuit 55 and an output signal of the latch circuit 55 is supplied to the latch circuit 56. A signal obtained by inverting the output of the latch circuit 55 using an inverter circuit 57 and an output signal of the latch circuit 56 are supplied to a NOR gate circuit 58. Accordingly, when the enable signal mBistEN is activated to a high level, one shot of an enable signal CLKEN synchronized with the internal clock signal ICLK is generated.

As shown in FIG. 3B, the clock divider circuit 41 includes eight latch circuits 61 to 68 coupled cyclically. Among these latch circuits, the latch circuits 68 and 61 to 63 form a first group, and the latch circuits 64 to 67 form a second group. An output signal of the latch circuit 64 is used as a fall trigger signal FT, and an output signal of the latch circuit 68 is used as a rise trigger signal RT. The rise trigger signal RT and the enable signal CLKEN are supplied to an OR gate circuit 60. An output signal of the OR gate circuit 60 is supplied in common to one input nodes of AND gate circuits 71 to 74. Division signals DIV78, DIV56, and DIV4 are supplied to the other input nodes of the AND gate circuits 71 to 73, respectively. The division signals DIV78, DIV56, and DIV4 are control signals generated based on the division signal DIV. The division signal DIV78 is activated to a high level in a case in which the division ratio designated by the division signal DIV indicates division by seven or eight, the division signal DIV56 is activated to a high level in a case in which the division ratio designated by the division signal DIV indicates division by five or six, and the division signal DIV4 is activated to a high level in a case in which the division ratio designated by the division signal DIV indicates division by four. The other input node of the AND gate circuit 74 is fixed to a high level.

Output signals of the AND gate circuits 71 to 74 are supplied to one input nodes of OR gate circuits 81 to 84, respectively. The other input nodes of the OR gate circuits 82 to 84 are respectively coupled to data output nodes Q of the latch circuits 61 to 63 at the preceding stages. The other input node of the OR gate circuit 81 is fixed to a low level. Output signals of the OR gate circuits 81 to 84 are respectively supplied to data input nodes D of the latch circuits 61 to 64. With this configuration, when the enable signal CLKEN or the rise trigger signal RT is activated, the fall trigger signal FT is generated by passage of a one-shot pulse through four latch circuits 61 to 64 in a case in which the division ratio indicates division by seven or eight, the fall trigger signal FT is generated by passage of a one-shot pulse through three latch circuits 62 to 64 in a case in which the division ratio indicates division by five or six, and the fall trigger signal FT is generated by passage of a one-shot pulse through two latch circuits 63 and 64 in a case in which the division ratio indicates division by four.

The fall trigger signal FT being the output signal of the latch circuit 64 is supplied in common to one input nodes of AND gate circuits 75 to 78. The division signals DIV78, DIV56, and DIV4 are supplied to the other input nodes of the AND gate circuits 75 to 77, respectively. The other input node of the AND gate circuit 78 is fixed to a high level. Output signals of the AND gate circuits 75 to 78 are supplied to one input nodes of OR gate circuits 85 to 88, respectively. The other input nodes of the OR gate circuits 86 to 88 are respectively coupled to data output nodes Q of the latch circuits 65 to 67 at the preceding stages. The other input node of the OR gate circuit 85 is fixed to a low level. Output signals of the OR gate circuits 85 to 88 are respectively supplied to data input nodes D of the latch circuits 65 to 68. With this configuration, when the fall trigger signal FT is activated, the rise trigger signal RT is generated by passage of a one-shot pulse through four latch circuits 65 to 68 in a case in which the division ratio indicates division by seven or eight, the rise trigger signal RT is generated by passage of a one-shot pulse through three latch circuits 66 to 68 in a case in which the division ratio indicates division by five or six, and the rise trigger signal RT is generated by passage of a one-shot pulse through two latch circuits 67 and 68 in a case in which the division ratio indicates division by four.

In this way, in a case in which the division ratio indicates division by seven or eight, the eight latch circuits 61 to 68 are cyclically coupled. In a case in which the division ratio indicates division by five or six, the latch circuits 61 and 65 are bypassed and the remaining six latch circuits 62 to 64 and 66 to 68 are cyclically coupled. In a case in which the division ratio indicates division by four, the latch circuits 61, 62, 65, and 66 are bypassed and the remaining four latch circuits 63, 64, 67, and 68 are cyclically coupled.

In the latch circuits 68 and 61 to 63 forming the first group, the latch clock signal LATCLK is supplied to the clock input nodes C and the latch clock signal LATCLKF is supplied to the inverted clock input nodes CE Meanwhile, clock switch circuits 94 to 97 are respectively allocated to the latch circuits 64 to 67 forming the second group. The clock switch circuits 94 to 97 interchange the latch clock signals LATCLK and LATCLKF to be input to the latch circuits 64 to 67 on the basis of a division signal DIV57. The division signal DIV57 is a control signal generated based on the division signal DIV and is activated in a case in which the division ratio designated by the division signal DIV indicates division by five or seven, that is, a case in which the division number is an odd number. The clock switch circuits 94 to 97 supply the latch clock signal LATCLK to the clock input nodes C and supply the latch clock signal LATCLKF to the inverted clock input nodes CF, respectively, similarly to the first group in a case in which the division signal DIV57 is in an inactive state, that is, a case in which the division number is an even number. In contrast, in a case in which the division signal DIV57 is in an active state, that is, a case in which the division number is an odd number, the clock switch circuits 94 to 97 supply the latch clock signal LATCLKF to the clock input nodes C and supply the latch clock signal LATCLK to the inverted clock input nodes CF, respectively, contrary to the first group.

The fall trigger signal FT and the rise trigger signal RT are supplied to a SR latch circuit 90. The SR latch circuit 90 is set in response to an inverted signal of the rise trigger signal RT and accordingly causes the divided clock signal mBistEXCLK to rise from a low level to a high level. The SR latch circuit 90 is reset in response to an inverted signal of the fall trigger signal FT and accordingly causes the divided clock signal mBistEXCLK to fall from the high level to the low level. The divided clock signal mBistEX-CLK is supplied to the mBist engine 44 via the multiplexer 43 shown in FIG. 2.

An operation of the clock divider circuit 41 is explained next with reference to FIGS. 4A to 4E being timing charts. FIGS. 4A to 4E are timing charts for explaining an operation of the clock divider circuit according to one embodiment of the present disclosure.

Figure 4A:
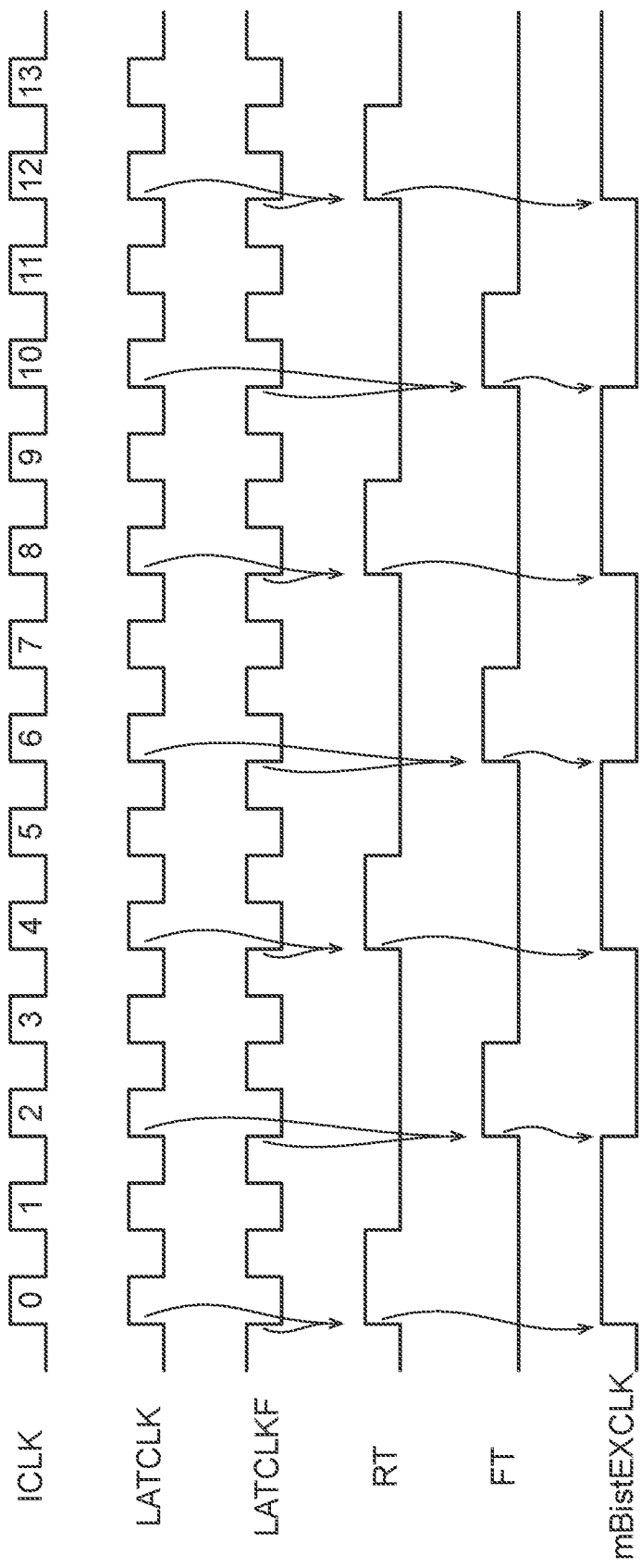
FIGS. 4A to 4E are timing charts for explaining an operation of the clock divider circuit according to one embodiment of the present disclosure.

In a case in which the division ratio designated by the division signal DIV indicates division by four, the division signal DIV4 is activated and the other division signals DIV56, DIV78, and DIV57 are inactivated. In this case, four latch circuits including the latch circuits 63, 64, 67, and 68 are cyclically coupled, so that each of the rise trigger signal RT and the fall trigger signal FT is activated every four clock cycles. For example, as shown in FIG. 4A, the rise trigger signal RT is activated in synchronization with rise edges 0, 4, 8, and 12 of the internal clock signal ICLK, and the fall trigger signal FT is activated in synchronization with rise edges 2, 6, and 10 of the internal clock signal ICLK. That is, the rise trigger signal RT and the fall trigger signal FT are alternately activated every two clock cycles. Accordingly, the divided clock signal mBistEXCLK becomes a signal obtained by dividing the internal clock signal ICLK by four and the duty ratio thereof becomes 50%.

Figure 4B:
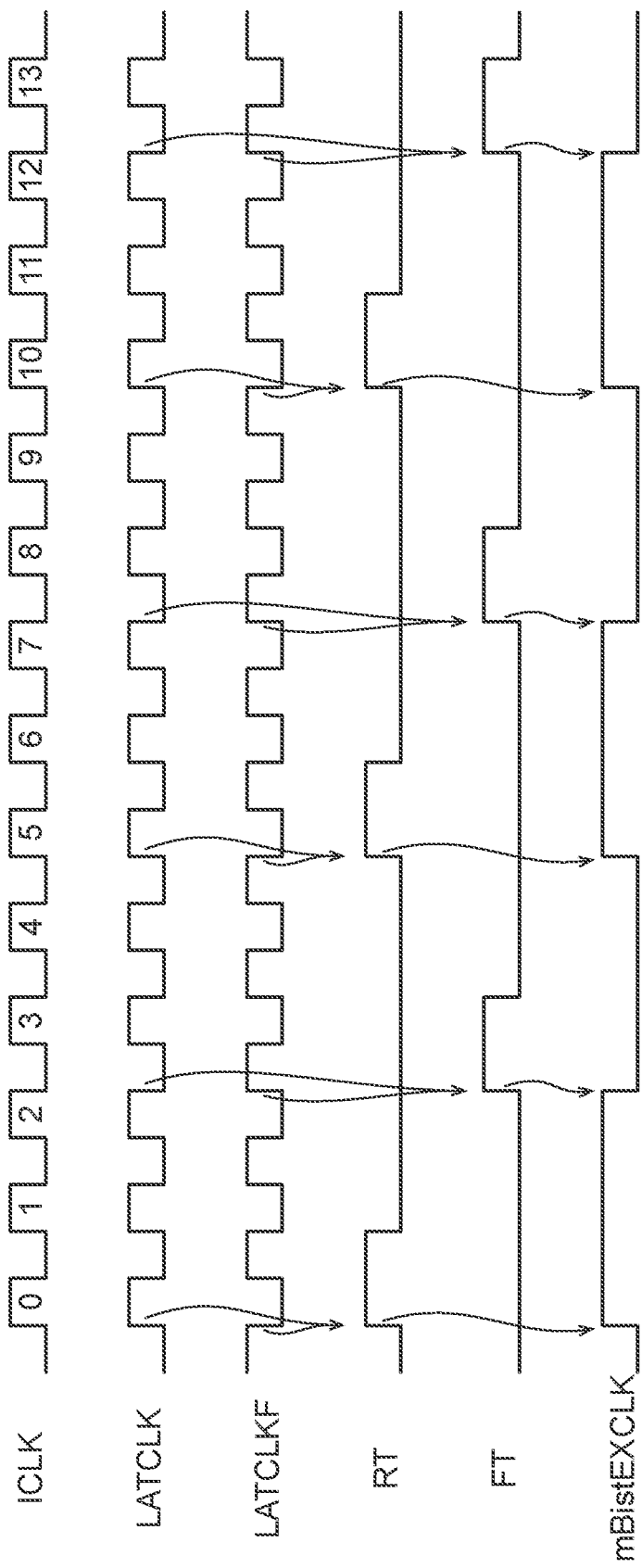

In a case in which the division ratio designated by the division signal DIV indicates division by five, the division signals DIV56 and DIV57 are activated and the other division signals DIV4 and DIV78 are inactivated. In this case, six latch circuits including the latch circuits 62 to 64 and 66 to 68 are cyclically coupled. Further, in this case, the latch clock signals LATCLK and LATCLKF input to the latch circuits 64, 66, and 67 are interchanged. Therefore, the period in which a one-shot pulse is transferred from the latch circuit 63 to the latch circuit 64 becomes a half clock cycle and the period in which a one-shot pulse is transferred from the latch circuit 67 to the latch circuit 68 also becomes a half clock cycle. Accordingly, each of the rise trigger signal RT and the fall trigger signal RT is activated every five clock cycles. For example, as shown in FIG. 4B, the rise trigger signal RT is activated in synchronization with rise edges 0, 5, and 10 of the internal clock signal ICLK and the fall trigger signal FT is activated in synchronization with fall edges 2, 7, and 12 of the internal clock signal ICLK. That is, the rise trigger signal RT and the fall trigger signal FT are alternately activated every 2.5 clock cycles. Therefore, the divided clock signal mBistEXCLK becomes a signal obtained by dividing the internal clock signal ICLK by five and the duty ratio thereof becomes 50%.

Figure 4C:
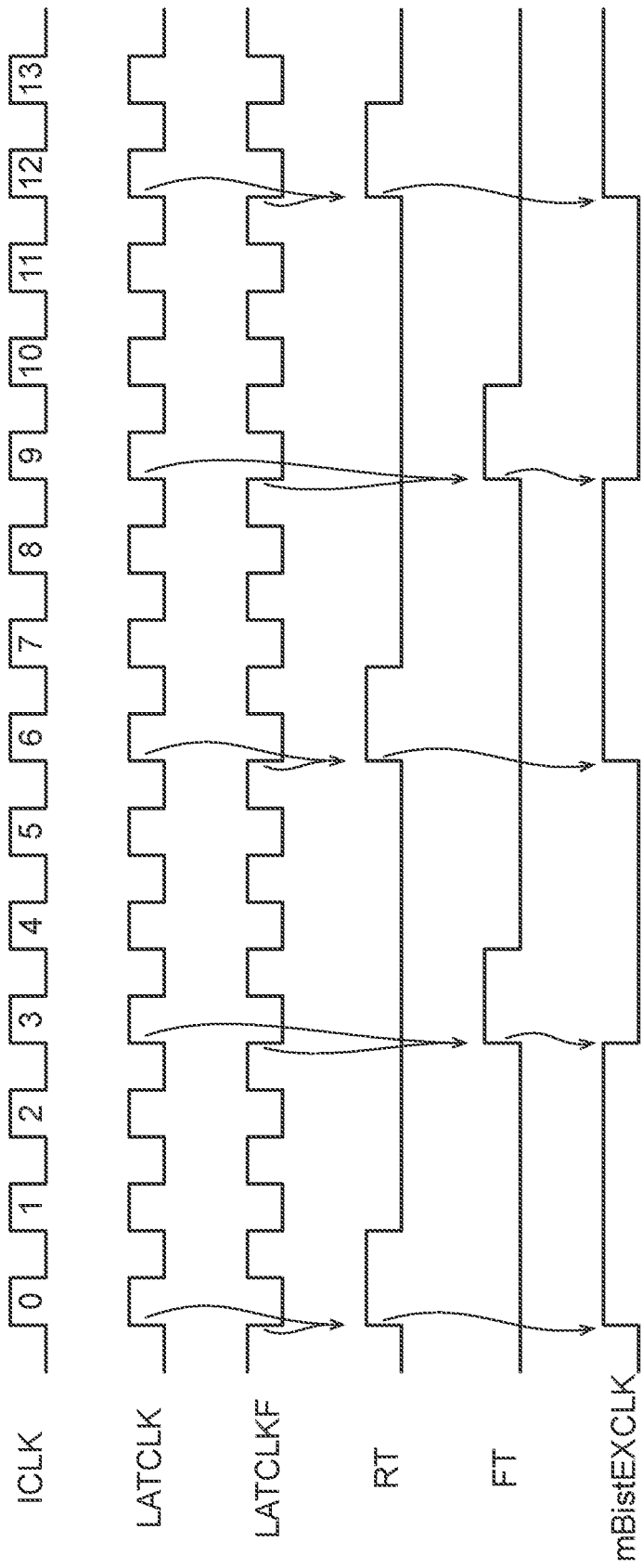

In a case in which the division ratio designated by the division signal DIV indicates division by six, the division signal DIV56 is activated and the other division signals DIV4, DIV78, and DIV57 are inactivated. In this case, six latch circuits including the latch circuits 62 to 64 and 66 to 68 are cyclically coupled, so that each of the rise trigger signal RT and the fall trigger signal FT is activated every six clock cycles. For example, as shown in FIG. 4C, the rise trigger signal RT is activated in synchronization with rise edges 0, 6, and 12 of the internal clock signal ICLK and the fall trigger signal FT is activated in synchronization with rise edges 3 and 9 of the internal clock signal ICLK. That is, the rise trigger signal RT and the fall trigger signal FT are alternately activated every three clock cycles. Accordingly, the divided clock signal mBistEXCLK becomes a signal obtained by dividing the internal clock signal ICLK by six and the duty ratio thereof becomes 50%.

Figure 4D:
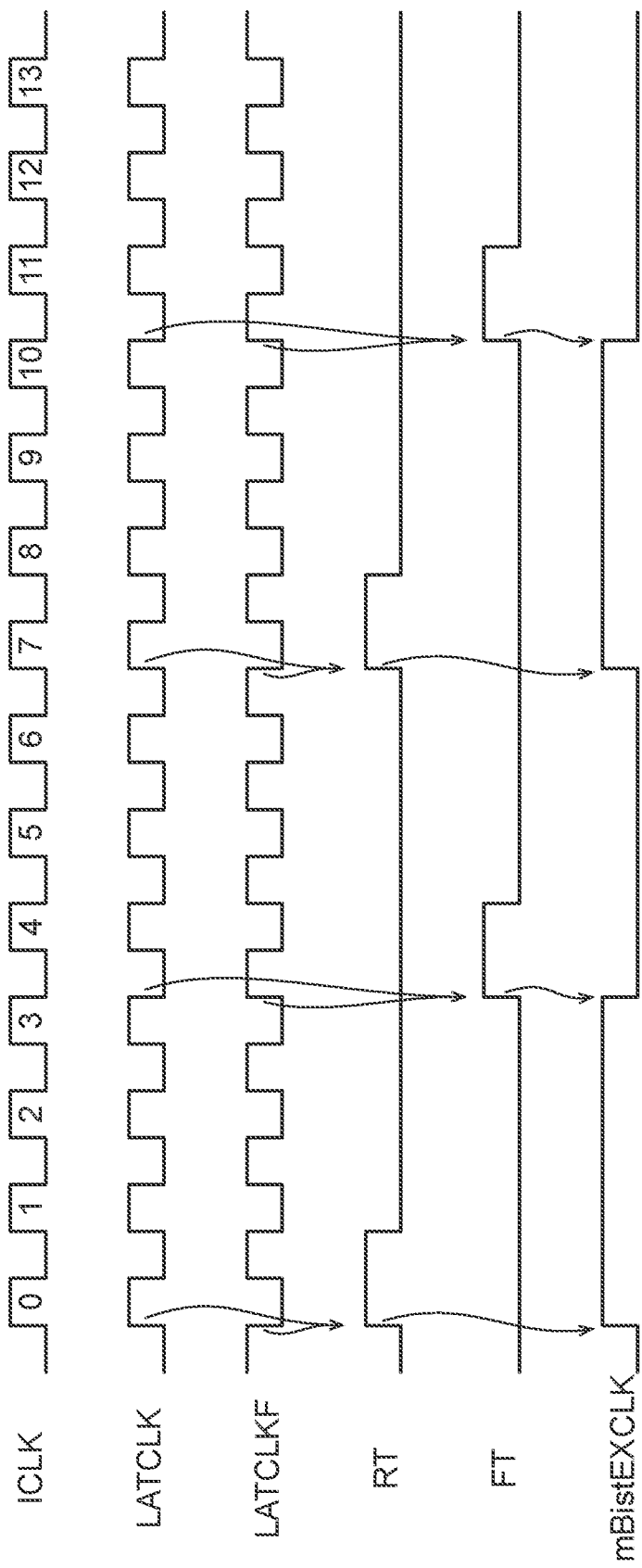

In a case in which the division ratio designated by the division signal DIV indicates division by seven, the division signals DIV78 and DIV57 are activated and the other division signals DIV4 and DIV56 are inactivated. In this case, eight latch circuits including the latch circuits 61 to 68 are cyclically coupled. Further, in this case, the latch clock signals LATCLK and LATCLKF to be input to the latch circuits 64 to 67 are interchanged. Accordingly, the period in which a one-shot pulse is transferred from the latch circuit 63 to the latch circuit 64 becomes a half clock cycle and the period in which a one-shot pulse is transferred from the latch circuit 67 to the latch circuit 68 also becomes a half clock cycle. Therefore, each of the rise trigger signal RT and the fall trigger signal FT is activated every seven cycles. For example, as shown in FIG. 4D, the rise trigger signal RT is activated in synchronization with rise edges 0 and 7 of the internal clock signal ICLK and the fall trigger signal FT is activated in synchronization with fall edges 3 and 10 of the internal clock signal ICLK. That is, the rise trigger signal RT and the fall trigger signal FT are alternately activated every 3.5 clock cycles. Accordingly, the divided clock signal mBistEXCLK becomes a signal obtained by dividing the internal clock signal ICLK by seven and the duty ratio thereof becomes 50%.

Figure 4E:
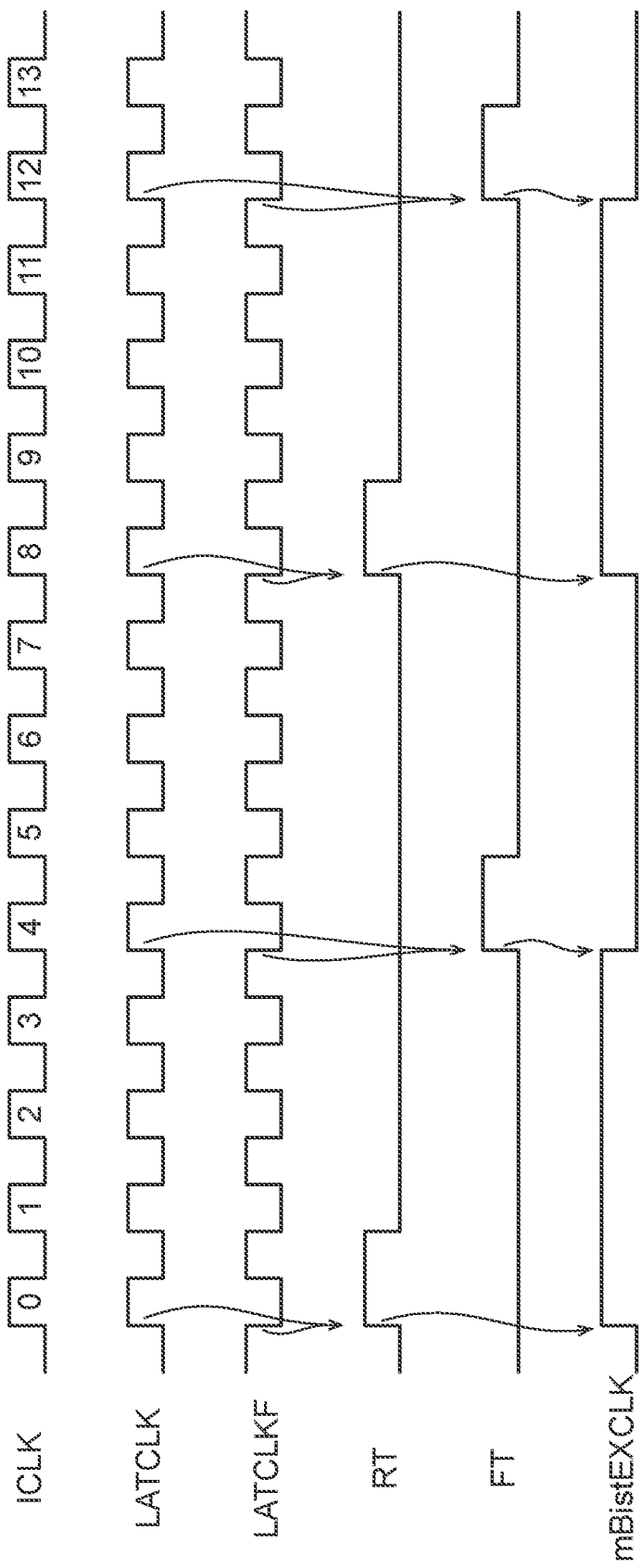

In a case in which the division ratio designated by the division signal DIV indicates division by eight, the division signal DIV78 is activated and the other division signals DIV4, DIV56, and DIV57 are inactivated. In this case, eight latch circuits including the latch circuits 61 to 68 are cyclically coupled, so that each of the rise trigger signal RT and the fall trigger signal FT is activated every eight clock cycles. For example, as shown in FIG. 4E, the rise trigger signal RT is activated in synchronization with rise edges 0 and 8 of the internal clock signal ICLK and the fall trigger signal FT is activated in synchronization with rise edges 4 and 12 of the internal clock signal ICLK. That is, the rise trigger signal RT and the fall trigger signal FT are alternately activated every four clock cycles. Accordingly, the divided clock signal mBistEXCLK becomes a signal obtained by dividing the internal clock signal ICLK by eight and the duty ratio thereof becomes 50%.

In this way, the clock divider circuit 41 according to the present embodiment includes the latch circuits 61 to 68 coupled cyclically and the latch clock signals LATCLK and LATCLKF to the latch circuits 64 to 67 forming the second group are interchanged in a case in which the division number is an odd number. Therefore, even when the division number is an odd number, the duty ratio can be kept at 50%.

Figure 5:
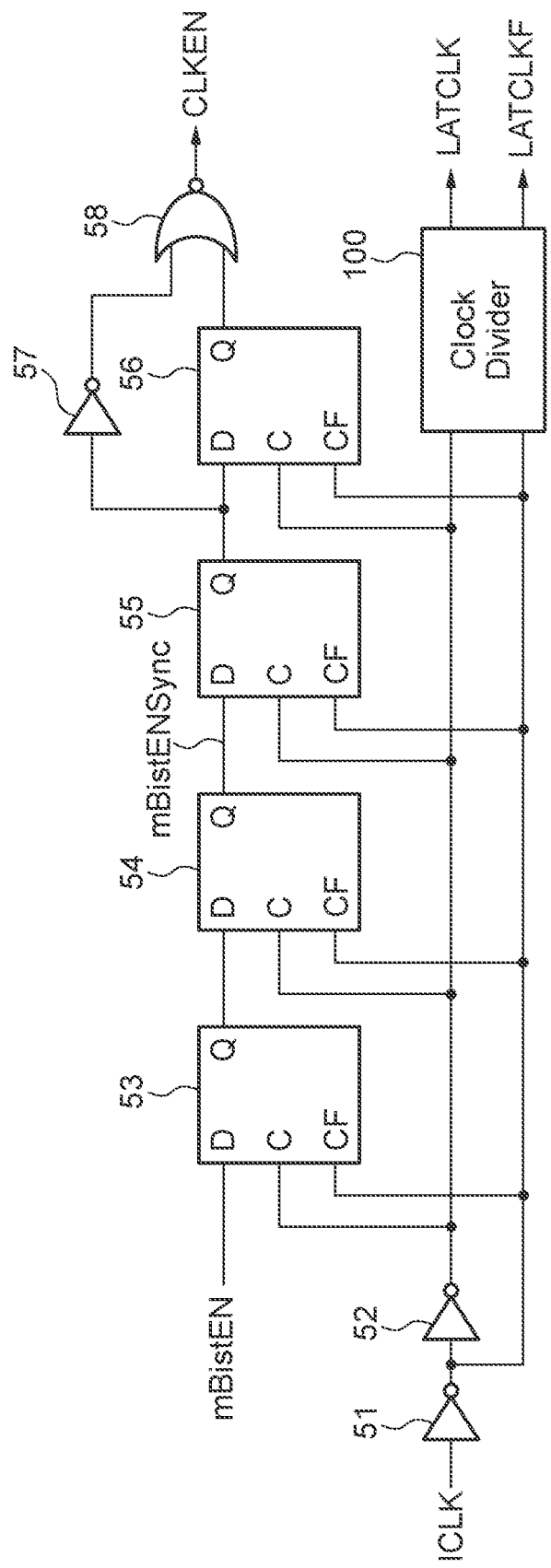
FIG. 5 is a circuit diagram of a clock divider circuit according to one embodiment of the present disclosure.

FIG. 5 is a circuit diagram of a clock divider circuit according to one embodiment of the present disclosure. While the frequencies of the internal clock signal ICLK and the latch clock signals LATCLK and LATCLKF are same in the embodiment described above, this point is not essential in the present invention. For example, the frequency of the latch clock signals LATCLK and LATCLKF may be lowered relative to that of the internal clock signal ICLK with provision of a divider circuit 100 that divides the internal clock signal ICLK as shown in FIG. 5. This can reduce the number of latch circuits coupled cyclically when the frequency of the internal clock signal ICLK is high.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

The invention claimed is:

1. An apparatus, comprising:
a first group including a plurality of first latch circuits coupled in series; and
a second group including a plurality of second latch circuits coupled in series, wherein
each of the first latch circuits is configured to perform a latch operation in synchronization with a rise trigger signal,
each of the second latch circuits is configured to perform a latch operation in synchronization with a fall trigger signal, the rise and fall trigger signals being alternately activated every even clock cycles or every odd clock cycles, and
in response to a division ratio, first one or more of the first and second latch circuits are bypassed and second one or more of the first and second latch circuits are cyclically coupled.

2. The apparatus of claim 1, wherein
the rise trigger signal and the fall trigger signal are alternately activated in synchronization with rise edges of a clock signal for every even clock cycles.

3. The apparatus of claim 1, wherein the rise trigger signal and the fall trigger signal are alternately activated in synchronization with rise edges of a clock signal for every odd clock cycles.

4. The apparatus of claim 1, wherein at least one of the first latch circuits in the first group is configured to output the rise trigger signal.

5. The apparatus of claim 4, wherein when the fall trigger signal is activated, the rise trigger signal is generated by passage of a one-shot pulse through the at least one of the first latch circuits in the first group and at least one of the second latch circuits in the second group.

6. The apparatus of claim 1, wherein
at least one of the second latch circuits in the second group is configured to output the fall trigger signal.

7. The apparatus of claim 6, wherein when the rise trigger signal is activated, the fall trigger signal is generated by passage of a one-shot pulse through the at least one of the second latch circuits in the second group and at least one of the first latch circuits in the first group.

8. The apparatus of claim 1, wherein
the division ratio indicates an even number.

9. The apparatus of claim 1, wherein
the division ratio indicates an odd number.

10. The apparatus of claim 1, wherein
the division ratio is designated by a division signal, and the division signal is a control parameter in a mode register circuit.

11. The apparatus of claim 1, wherein the first group comprises a first shift register circuit, and the second group comprises a second shift register circuit.

12. The apparatus of claim 1, further configured to output a divided clock signal for a test of a memory cell array in response to the rise trigger signal or the fall trigger signal.

13. An apparatus, comprising:
a test circuit configured to generate signals for a test of a memory cell array in synchronization with a divided clock signal; and
a clock divider circuit configured to generate the divided clock signal in response to a division ratio, the clock divider circuit comprising:
a plurality of first latch circuits coupled in series; and
a plurality of second latch circuits coupled in series, wherein
each of the first latch circuits is configured to perform a latch operation in synchronization with one of a rise trigger signal and a fall trigger signal, the rise and fall trigger signals being alternately activated every odd clock cycles or every even clock cycles,
each of the second latch circuits is configured to perform a latch operation in synchronization with another of the rise trigger signal and the fall trigger signal, and
in response to the division ratio, one or more of the first latch circuits and one or more of the second latch circuits are bypassed, and remaining of the first and second latch circuits are cyclically coupled.

14. The apparatus of claim 13,
wherein the rise trigger signal and the fall trigger signal are alternately activated in synchronization with rise edges of a clock signal for every even clock cycles or every odd clock cycles.

15. The apparatus of claim 13,
further comprising a third latch circuit configured to be set in response to one of the rise and fall trigger signals and cause the divided clock signal to change from a first logic level to a second logic level.

16. The apparatus of claim 15, wherein the third latch circuit configured to be reset in response to another of the rise and fall trigger signals and cause the divided clock signal to change from the second logic level to the first logic level.

17. The apparatus of claim 13, wherein the clock divider circuit is a part of the test circuit.

18. A semiconductor device, comprising:
a memory cell array;
an access control circuit configured to access the memory cell array by using an internal address signal and an internal command signal; and
a test circuit configured to supply the internal address signal and the internal command signal to the access control circuit in synchronization with a first clock signal, the test circuit comprising:
an oscillator circuit configured to generate an oscillator signal;
a clock divider circuit configured to generate a divided clock signal by using a plurality of latch circuits coupled cyclically; and
a multiplexer configured to supply the first clock signal as one of the oscillator signal and the divided clock signal based on a clock selection signal, wherein
the plurality of latch circuits include a first group of latch circuits and a second group of latch circuits,
an output signal of one latch circuit of the first group is a rise trigger signal and an output signal of one latch circuit of the second group is a fall trigger signal,
when the fall trigger signal is activated, the rise trigger signal is generated by passage of a one-shot pulse through the one latch circuit of the first group and at least one latch circuit of the second group and, and
when the rise trigger signal is activated, the fall trigger signal is generated by passage of a one-shot pulse through the one latch circuit of the second group and at least one latch circuit of the first group.

19. The semiconductor device of claim 18, wherein the rise trigger signal and the fall trigger signal are alternately activated in synchronization with rise edges of a second clock signal for every even clock cycles indicated by a division ratio.

20. The semiconductor device of claim 18, wherein the rise trigger signal and the fall trigger signal are alternately activated in synchronization with rise edges of a second clock signal for every odd clock cycles indicated by a division ratio.

* * * * *